United States Patent
Sagawa et al.

(10) Patent No.: US 9,960,289 B2
(45) Date of Patent: *May 1, 2018

(54) SOLDER JOINT MATERIAL AND METHOD OF MANUFACTURING THE SAME, SOLDERING MEMBER AND SOLAR CELL MODULE

(71) Applicant: Hitachi Metals, Ltd., Tokyo (JP)

(72) Inventors: Hideyuki Sagawa, Naka-gun (JP); Keisuke Fujito, Mito (JP); Takayuki Tsuji, Kitaibaraki (JP); Hiromitsu Kuroda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/497,655

(22) Filed: Sep. 26, 2014

(65) Prior Publication Data

US 2015/0155402 A1 Jun. 4, 2015

(30) Foreign Application Priority Data

Nov. 29, 2013 (JP) ................. 2013-248020

(51) Int. Cl.
*H01L 31/0224* (2006.01)
*B23K 35/02* (2006.01)
(Continued)

(52) U.S. Cl.
CPC .. *H01L 31/022425* (2013.01); *B23K 35/0222* (2013.01); *B23K 35/0227* (2013.01); *B23K 35/0238* (2013.01); *B23K 35/26* (2013.01); *B23K 35/262* (2013.01); *B23K 35/30* (2013.01); *B23K 35/302* (2013.01); *B23K 35/36* (2013.01); *B23K 35/3602* (2013.01); *C22C 9/00* (2013.01); *C22C 13/00* (2013.01); *C23C 10/28* (2013.01);
(Continued)

(58) Field of Classification Search
None
See application file for complete search history.

(56) References Cited

U.S. PATENT DOCUMENTS 3,729,294 A * 4/1973 Hibbs, Jr. ............... B05D 7/14
428/380
6,120,906 A * 9/2000 Terashi ................. C03C 14/004
257/E23.009
(Continued)

FOREIGN PATENT DOCUMENTS

CN 1322857 A 11/2001
JP 3151303 * 5/2009

OTHER PUBLICATIONS

JP62-040361_HT Feb. 21, 1987.*
(Continued)

*Primary Examiner* — Vera Katz
(74) *Attorney, Agent, or Firm* — Roberts Mlotkowski Safran Cole & Calderon P.C.

(57) ABSTRACT

A solder joint material includes a copper-based metal material including mainly a copper, a surface-treated layer that is provided on the copper-based metal material and includes an amorphous layer including oxygen and a metal with a higher oxygen affinity than a copper, and a Sn-based solder plating layer provided on the surface-treated layer.

13 Claims, 5 Drawing Sheets

(51) Int. Cl.
- B23K 35/26 (2006.01)
- B23K 35/30 (2006.01)
- B23K 35/36 (2006.01)
- C22C 13/00 (2006.01)
- C22C 9/00 (2006.01)
- C23C 28/02 (2006.01)
- C23C 30/00 (2006.01)
- C23C 10/28 (2006.01)

(52) U.S. Cl.
CPC ............ C23C 28/021 (2013.01); *Y02B 10/12* (2013.01); *Y02E 10/50* (2013.01); *Y10T 428/1266* (2015.01)

(56) References Cited

U.S. PATENT DOCUMENTS

| | | | |
|---|---|---|---|
| 8,609,246 B2 | 12/2013 | Sun et al. | |
| 2005/0127364 A1* | 6/2005 | Inoue | C22C 5/06 257/72 |
| 2010/0112353 A1 | 5/2010 | Sun et al. | |
| 2010/0266870 A1 | 10/2010 | Nishimura | |
| 2011/0123729 A1* | 5/2011 | Lee | G02F 1/133512 428/1.6 |
| 2012/0276694 A1* | 11/2012 | Koezuka | H01L 29/7869 438/151 |
| 2012/0318361 A1* | 12/2012 | Teeter | H01L 31/0326 136/264 |
| 2013/0243940 A1* | 9/2013 | Kamath | H01L 29/78603 427/97.1 |
| 2013/0323532 A1* | 12/2013 | Sagawa | B32B 15/01 428/659 |
| 2014/0302342 A1* | 10/2014 | Aoyama | C22F 1/08 428/639 |
| 2015/0152567 A1* | 6/2015 | Sagawa | C25D 7/0614 428/639 |
| 2015/0156870 A1* | 6/2015 | Sagawa | H05K 3/282 174/251 |

OTHER PUBLICATIONS

Alford et. al. Appl. Phys. Letters, 94, 2009, 1-3.*
Japanese Application 2013-248020 Office Action dated Jan. 24, 2017 and English translation thereof.
Office Action issued in the corresponding Chinese Application No. 2014105107908 dated Sep. 5, 2017.

* cited by examiner

3 SURFACE-TREATED LAYER
4 DIFFUSION LAYER
5 AMORPHOUS LAYER

SOLDER JOINT MATERIAL AND METHOD OF MANUFACTURING THE SAME, SOLDERING MEMBER AND SOLAR CELL MODULE

The present application is based on Japanese patent application No. 2013-248020 filed on Nov. 29, 2013, the entire contents of which are incorporated herein by reference.

BACKGROUND OF THE INVENTION

1. Field of the Invention

The invention relates to a solder joint material and a method of manufacturing the solder joint material, a soldering member and a solar cell module.

2. Description of the Related Art

If a bare copper is used as a soldering member, an oxide film formed hinders wetting of the solder and this results in poor solder bondability.

In addition, a brittle intermetallic compound ($Cu_6Sn_5$) layer is formed at an interface between copper and Sn-based solder due to heat during soldering. $Cu_6Sn_5$ is a hexagonal crystal at high temperature but transforms into an orthorhombic crystal at low temperature. This causes cracks, etc., to develop and decreases joint reliability after soldering. This applies not only to bare copper but also to Sn-plated copper or Sn-based solder-plated copper. In products of Sn-plated copper or Sn-based solder-plated copper which are subjected to heat during soldering or are used at high temperature, $Cu_6Sn_5$ formed during hot-dipping further grows due to heat applied to use the products.

To prevent such a problem, WO2009/051255 discloses obtaining an interface compound $(Cu,Ni)_6Sn_5$ by adding an appropriate amount of Ni to the solder so as to prevent the occurrence of cracks based on the concept that the hexagonal crystal is stable even at room temperature.

SUMMARY OF THE INVENTION

The method disclosed in WO2009/051255 may cause an increase in a melting point of the solder. Therefore, a problem may arise that the bondability decreases when processed at a lower temperature so as to, e.g., reduce a load applied to components on a substrate during reflow.

It may be devised that the soldering is conducted at a low temperature to prevent the formation/growth of $Cu_6Sn_5$. However, due to the poor molten metal flow, the bondability may decrease even in this case.

It is an object of the invention to provide a solder joint material that is excellent in solder bondability and joint reliability after soldering, as well as a method of manufacturing the older joint material, a soldering member, and a solar cell module using the solder joint material or the soldering member.

(1) According to one embodiment of the invention, a solder joint material comprises:
a copper-based metal material comprising mainly a copper;
a surface-treated layer that is provided on the copper-based metal material and comprises an amorphous layer comprising oxygen and a metal with a higher oxygen affinity than a copper; and
a Sn-based solder plating layer provided on the surface-treated layer.

In the above embodiment (1) of the invention, the following modifications and changes can be made.
(i) The solder joint material is plate-shaped, and wherein the surface-treated layer and the Sn-based solder plating layer are provided on one side or both sides of the copper-based metal material.
(ii) The solder joint material is wire-shaped, and wherein the surface-treated layer covers an outer periphery of the copper-based metal material and the Sn-based solder plating layer covers an outer periphery of the surface-treated layer.
(iii) The amorphous layer further comprises a copper diffused from the copper-based metal material.
(iv) The surface-treated layer further comprises a diffusion layer under the amorphous layer, and wherein the diffusion layer comprises a copper and a metal with a higher oxygen affinity than the copper, or oxygen, a copper and a metal with a higher oxygen affinity than the copper.
(v) The metal with a higher oxygen affinity than copper comprises zinc.
(vi) The surface-treated layer has a thickness of not less than 8 nm and not more than 300 nm.

(2) According to another embodiment of the invention, a soldering member comprises:
a copper-based metal material comprising mainly a copper; and
a surface-treated layer that is provided on the copper-based metal material and comprises an amorphous layer comprising oxygen and a metal with a higher oxygen affinity than a copper,
wherein the surface-treated layer has a thickness of not less than 8 nm and not more than 300 nm.

In the above embodiment (2) of the invention, the following modifications and changes can be made.
(vii) The metal with a higher oxygen affinity than copper comprises zinc.

(3) According to another embodiment of the invention, a solar cell module comprises:
the solder joint material according to the embodiment (1); and
a solar cell soldered by using the solder joint material.

(4) According to another embodiment of the invention, a solar cell module comprises:
the soldering member according to the embodiment (2); and
a solar cell soldered by using the soldering member.

(5) According to another embodiment of the invention, a method of manufacturing a solder joint material comprises:
forming a layer comprising a metal with a higher oxygen affinity than a copper on a surface of the copper-based metal material comprising mainly a copper and then heat-treating the formed layer at a temperature of not less than 30° C. and not more than 300° C. for not less than 5 seconds and not more than 60 minutes so as to have a surface-treated layer; and
forming a Sn-based solder plating layer on the surface-treated layer.

In the above embodiment (5) of the invention, the following modifications and changes can be made.
(viii) The metal with a higher oxygen affinity than copper comprises zinc.
(ix) The surface-treated layer has a thickness of not less than 8 nm and not more than 300 nm.

EFFECTS OF THE INVENTION

According to one embodiment of the invention, a solder joint material can be provided that is excellent in solder bondability and joint reliability after soldering, as well as a method of manufacturing the older joint material, a soldering member, and a solar cell module using the solder joint material or the soldering member.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Configuration of Solder Joint Material

Solder joint materials in the embodiments of the invention are provided with a copper-based metal material includes mainly a copper; a surface-treated layer which is provided on the copper-based metal material and has an amorphous layer containing oxygen and a metal with a higher oxygen affinity than copper; and a Sn-based solder plating layer provided on the surface-treated layer. It is mainly embodied in the plate form and the wire form, and a plate-shaped solder joint material (the first embodiment) and a wire-shaped solder joint material (the second embodiment) will be respectively described below.

First Embodiment

A solder joint material in the first embodiment of the invention has a plate-like shape in which the surface-treated layer and the Sn-based solder plating layer are sequentially provided on each of a pair of opposing sides of the Cu-based metal sheet which has a rectangular cross section. The layers here are provided on both sides of the Cu-based metal sheet but it is not limited thereto. The surface-treated layer and the Sn-based solder plating layer may be sequentially provided on only one side of the Cu-based metal sheet.

Figure 1:
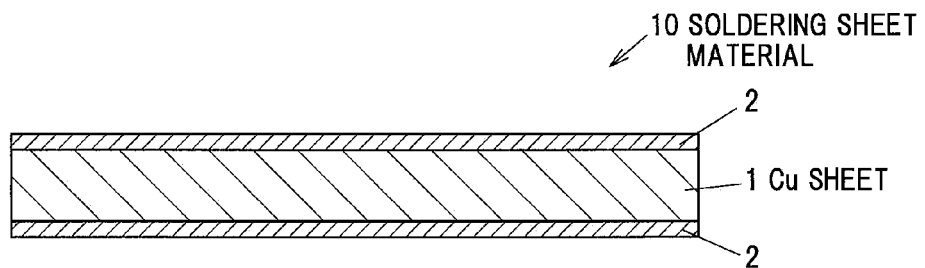
FIG. 1 is a schematic cross sectional view showing a soldering member in a first embodiment of the present invention.
Figure 2:
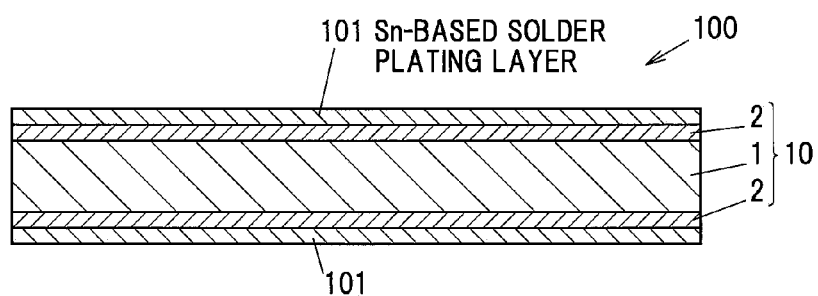
FIG. 2 is a schematic cross sectional view showing a solder joint material in the first embodiment of the invention.
Figure 3:
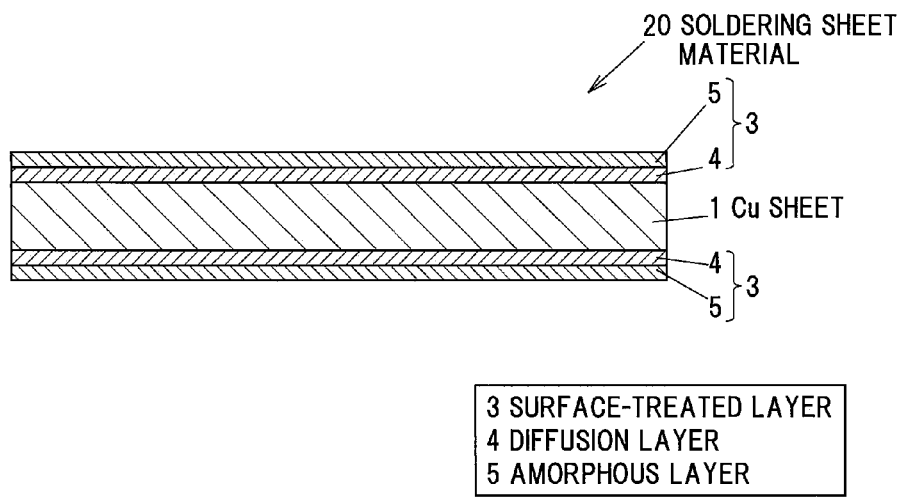
FIG. 3 is a schematic cross sectional view showing a modification of the soldering member in the first embodiment of the invention.

FIG. 1 is a schematic cross sectional view showing a soldering member in the first embodiment of the invention and FIG. 2 is a schematic cross sectional view showing a solder joint material in the first embodiment of the invention. FIG. 3 is a schematic cross sectional view showing a modification of the soldering member in the first embodiment of the invention.

A soldering sheet material (soldering member) 10 shown in FIG. 1 is provided with a Cu-based metal sheet 1 (hereinafter, sometimes simply referred as "Cu sheet") and surface-treated layers 2 provided on a pair of opposing sides thereof. A plate-shaped solder joint material 100 shown in FIG. 2 is composed of the soldering sheet material 10 and Sn-based solder plating layers 101 provided on surfaces of the surface-treated layers 2 by plating with Sn-based solder.

The Cu sheet 1 contains Cu as a major component which is preferably contained in an amount of not less than 90 mass %. That is, Cu alone or a Cu alloy containing not more than 10 mass % of impurities is preferable. It is possible to use, e.g., pure copper such as oxygen-free copper or tough pitch copper, or dilute-copper alloys containing 3 to 15 mass ppm of sulfur, 2 to 30 mass ppm of oxygen and 5 to 55 mass ppm of Ti.

The thickness of the Cu sheet 1 is not specifically limited and the Cu sheet 1 can have various thicknesses. It is possible to use the Cu sheet 1 having a thickness of, e.g., from 0.1 mm to 5.0 mm.

The surface-treated layer 2 has an amorphous layer containing oxygen and a metal with a higher oxygen affinity than copper. Alternatively, the surface-treated layer 2 may have an amorphous layer containing oxygen, a metal with a higher oxygen affinity than copper and copper diffused from the Cu sheet 1.

The surface-treated layer may be a surface-treated layer 3 having an amorphous layer 5 and a diffusion layer 4 which is formed thereunder and contains copper and a metal with a higher oxygen affinity than copper, or preferably oxygen, copper and a metal with a higher oxygen affinity than copper, as is the modification (a soldering sheet material 20) shown in FIG. 3. The diffusion layer 4 is different from the amorphous layer 5 in that it is a crystalline layer.

The metal with a higher oxygen affinity than copper, which constitutes the surface-treated layer 2 (amorphous layer) and the amorphous layer 5, is preferably zinc. Besides zinc, it is possible to use, e.g., Ti, Mg, Zr, Al, Fe, Sn and Mn, etc. Ti, Mg and Zr, which are easily oxidized and removed at the time of manufacturing copper, are particularly preferable from the viewpoint of recycling. The same applies to the metal with a higher oxygen affinity than copper, which constitutes the diffusion layer 4, and it is preferable to use the same metal as the metal with a higher oxygen affinity than copper, which constitutes the amorphous layer.

The amorphous layer with randomly-arranged elements is considered to have a denser structure than a crystalline layer with regularly-arranged elements. Therefore, copper diffusion to the surface of the surface-treated layer and oxygen ingress into a copper raw material, which cause oxidation of the copper raw material, are suppressed or reduced by the amorphous layer. It is believed that the amorphous layer thereby serves as a barrier layer which inhibits bonding between copper and oxygen.

Oxygen needs to preferentially bond to a metal other than copper so that the amorphous layer is formed. Then, in order to accelerate the formation of the amorphous layer, it is preferable that a metal with a higher oxygen affinity than copper (e.g., zinc) be arranged on the surface of the Cu sheet 1.

Different types of elements are in contact with each other at an interface between the surface-treated layers 2 and 3 and another layer and a gradual concentration change is generally seen at such an interface, which makes difficult to define the thickness of the surface-treated layer. Therefore, the thickness of the surface-treated layer in the invention is defined as "a thickness of a layer which contains oxygen, a metal with a higher oxygen affinity than copper and, in some cases, copper, and in which each of the constituent elements is contained in the amount of not less than 2 at % in terms of atomic concentration (at %) as an elemental content ratio".

The thickness of the surface-treated layer 2 is preferably not less than 8 nm and not more than 300 nm depending on the heat treatment conditions, more preferably not less than 10 nm and not more than 250 nm, and further preferably not less than 12 nm and not more than 200 nm. Meanwhile, the thickness of the surface-treated layer 3 is preferably not less than 8 nm and not more than 300 nm as the total of the thickness of the diffusion layer 4 and the thickness of the amorphous layer 5. An effect of suppressing growth of $Cu_6Sn_5$ compound is reduced when the surface-treated layer is too thin.

When the diffusion layer 4 is provided, the lower limit of the thickness thereof is not specifically limited as long as the Cu sheet 1 is covered, and the lower limit of coating thickness is preferably about 3 nm in effect. In addition, the upper limit of the thickness of the diffusion layer 4 is preferably not more than 300 nm. When the diffusion layer 4 is more than 300 nm, the amorphous layer 5 contributing to develop high oxidation resistance may be stabilized and become less likely to be formed. The thickness of the amorphous layer 5 is not specifically limited but is preferably not less than 5 nm.

It is possible to form the Sn-based solder plating layer 101 by plate processing using solder including mainly Sn, e.g., Sn—Cu solder, Sn—Pb solder, Sn—Ag solder, Sn—Zn solder or Sn—Bi solder, etc. It is preferable to use a Pb-free Sn-based solder which does not contain lead. In detail, it is possible to suitably use Sn—Ag—Cu solder (e.g., Sn-3.0Ag-0.5Cu), Sn—Cu solder (e.g., Sn-0.7Cu) and Sn—Ag solder (e.g., Sn-3.5Ag), etc.

The thickness of the Sn-based solder plating layer 101 is preferably not less than 0.1 μm and not more than 50 μm, more preferably not less than 2 μm and not more than 40 μm, and further preferably not less than 5 μm and not more than 30 μm. Solder joint strength decreases when the Sn-based solder plating layer 101 is too thin, while an effect of suppressing growth of $Cu_6Sn_5$ compound is reduced when the Sn-based solder plating layer 101 is too thick.

Method of Manufacturing Solder Joint Material

Next, a method of manufacturing the solder joint material in the first embodiment will be described.

In case that a metal with a higher oxygen affinity than copper is, e.g., zinc, Zn layers are formed on the surfaces of the Cu sheet 1 by electrolytic plating in size and shape of the finished product. By subsequent heating in the ambient air at a temperature of not less than 30° C. and not more than 300° C. for not less than 5 seconds and not more than 60 minutes, the surface-treated layers 2 (amorphous layers) are formed. The thickness of the Zn layer is preferably not less than 8 nm and not more than 0.3 μm, more preferably not less than 10 nm and not more than 0.25 μm, and further preferably not less than 12 nm and not more than 0.2 μm. A soldering sheet material provided with the surface-treated layers 2 having the amorphous layer containing at least zinc and oxygen is thus obtained. In other words, it is possible to form the surface-treated layer 2 (amorphous layer) on the surface of the Cu sheet 1 by a simple method in which a zinc cover layer is simply provided and heat-treated under the predetermined conditions.

In the first embodiments, the cover layer is heat-treated preferably at a temperature of not less than 30° C. and not more than 300° C. for not less than 5 seconds and not more than 60 minutes as described above, more preferably at a temperature of not less than 40° C. and not more than 150° C. for not less than 20 seconds and not more than 30 minutes, and further preferably at a temperature of not less than 50° C. and not more than 100° C. for not less than 30 seconds and not more than 15 minutes. In addition, a plating process can be suitably used for forming the Zn layer. In addition to the plating process, it is possible to use a sputtering method, a vacuum deposition method and a cladding process, etc.

Alternatively, as a manufacturing method in another embodiment, the surface-treated layer 2 (amorphous layer) may be formed by preliminarily plating zinc before processing into the size and shape of the finished product and heat-treating after processing into the size and shape of the finished product.

Meanwhile, the diffusion layer 4 can be formed by, e.g., covering the surface of the Cu sheet 1 with zinc before forming the amorphous layer 5 of the surface-treated layer 3 and then heating in the ambient air or holding in an oil bath or salt bath at a temperature of not less than 50° C. Alternatively, the diffusion layer 4 may be manufactured using electric resistance heat. After that, the amorphous layer 5 is formed on the surface of the diffusion layer 4 by the same method as that used for forming the surface-treated layer 2 (amorphous layer).

After forming the surface-treated layers, the Sn-based solder plating layers 101 are formed thereon by a plating process using a Sn-based solder. The Sn-based solder plating is carried out by dipping the Cu sheet with the surface-treated layers in a molten solder bath. Alternatively, the Sn-based solder plating layer can be formed by electroplating.

Second Embodiment

A solder joint material in the second embodiment of the invention has a wire-like shape in which the surface-treated layer covers an outer periphery of the Cu-based metal material having a circular cross section and the Sn-based solder plating layer covers an outer periphery of the surface-treated layer.

Figure 4:
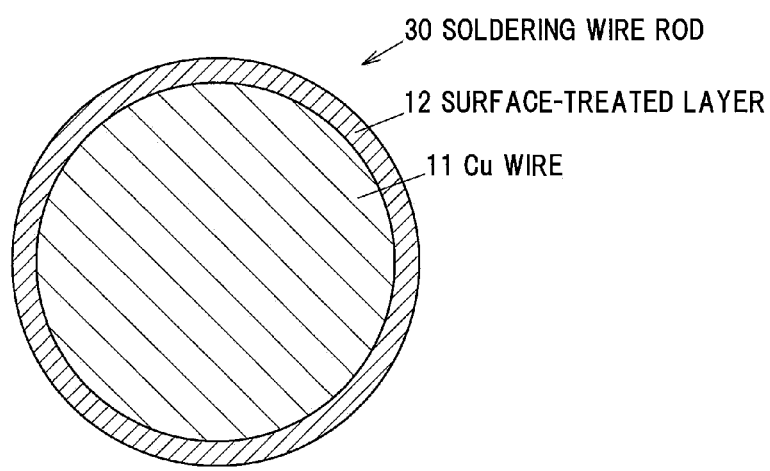
FIG. 4 is a schematic cross sectional view showing a soldering member in a second embodiment of the invention.
Figure 5:
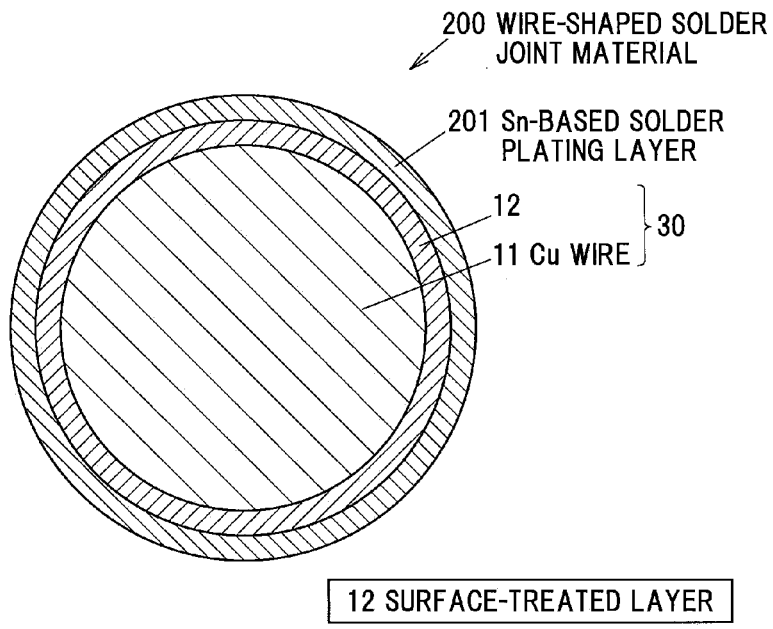
FIG. 5 is a schematic cross sectional view showing a solder joint material in the second embodiment of the invention.
Figure 6:
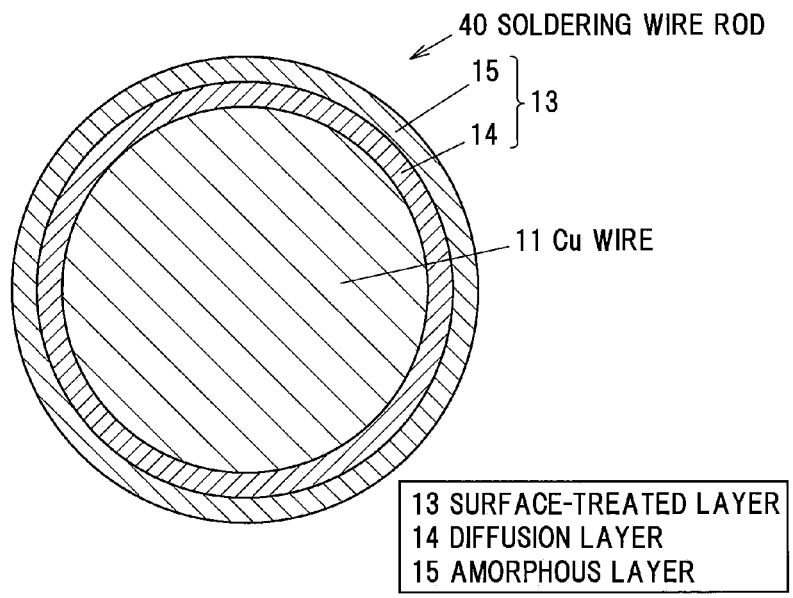
FIG. 6 is a schematic cross sectional view showing a modification of the soldering member in the second embodiment of the invention.

FIG. 4 is a schematic cross sectional view showing a soldering member in the second embodiment of the invention and FIG. 5 is a schematic cross sectional view showing a solder joint material in the second embodiment of the invention. FIG. 6 is a schematic cross sectional view showing a modification of the soldering member in the second embodiment of the invention.

A soldering wire rod (soldering member) 30 shown in FIG. 4 is provided with a columnar Cu-based metal wire 11 (hereinafter, sometimes simply referred as "Cu wire") having a circular cross section and a surface-treated layer 12 covering the outer periphery of the Cu wire 11. A wire-shaped solder joint material 200 shown in FIG. 5 is composed of the soldering wire rod 30 and a Sn-based solder plating layer 201 provided on the outer periphery of the surface-treated layer 12 by plating with a Sn-based solder.

The surface-treated layer may be a surface-treated layer 13 having an amorphous layer 15 and a diffusion layer 14 which is formed thereunder and contains copper and a metal with a higher oxygen affinity than copper, or preferably oxygen, copper and a metal with a higher oxygen affinity than copper, as is the as is the modification (a soldering wire rod 40) shown in FIG. 6.

The materials of the Cu wire 11, the surface-treated layer 12, the diffusion layer 14, the amorphous layer 15 and the Sn-based solder plating layer 201 are respectively the same as the materials of the Cu sheet 1, the surface-treated layer 2, the diffusion layer 4, the amorphous layer 5 and the Sn-based solder plating layer 101 in the first embodiment.

The diameter of the Cu wire 11 can be, e.g., from 0.1 μm to 5.0 mm.

The thicknesses of the surface-treated layers 12 and 13 are the same as those of the surface-treated layers 2 and 3 in the first embodiment. Also, the thicknesses of the diffusion layer 14 and the amorphous layer 15 are the same as those of the diffusion layer 4 and the amorphous layer 5 in the first embodiment.

Although FIGS. 4 to 6 show the embodiments in which the cross section is a circular shape, it is not limited thereto. Various embodiments, e.g., an oval shape or a rectangular shape, etc., can be implemented.

Method of Manufacturing Solder Joint Material

Next, a method of manufacturing the wire-shaped solder joint material in the second embodiment will be described.

A Zn layer is formed on the outer periphery of the Cu wire 11 by electrolytic plating and heat treatment is performed by the same method as that used for forming the surface-treated layer 2 (amorphous layer), thereby forming the surface-treated layer 12 (amorphous layer). The method of forming the surface-treated layer 13 (the diffusion layer 14 and the amorphous layer 15) is the same as that used for forming the surface-treated layer 3 (the diffusion layer 4 and the amorphous layer 5). The soldering wire rods 30 and 40 can be manufactured by these processes. After that, the Sn-based solder plating layer 201 is formed on the outer periphery of the soldering wire rod 30 or 40 by the same method as that used for forming the Sn-based solder plating layer 101 described above.

Intended Use

The solder joint materials in the embodiments of the invention can be used as a die-bonding material for semiconductor devices having various structures, a lead material, a sealing material and a joint material for insulating substrates. Examples of the application include diodes for alternator, IGBT modules, front-end modules such as RF modules, vehicle power modules, LEDs, MOSFETs for protective circuit of lithium-ion battery and ceramic substrates such as DBC substrates or DBA substrates.

It is possible to suitably use particularly for joining solar cells and, in such a case, it is possible to obtain a solar cell module provided with the solder joint material in the embodiments and solar cells soldered using the solder joint material. Alternatively, the soldering member in the embodiments may be used together with Sn—Ag—Cu solder, etc., to join solar cells to obtain a solar cell module. In these cases, it is preferable to use a rectangular solder joint material or soldering member.

Effects of the Embodiments

In the embodiments of the invention, oxidation resistance is imparted since the surface-treated layer 2, 3, 12 or 13, which serves as a barrier layer for suppressing or reducing copper diffusion to the surface of the surface-treated layer and oxygen ingress into the Cu-based metal material, is formed on the surface of the Cu-based copper material, this allows growth of an oxide film on the surface of the Cu-based metal material to be suppressed during storage, and it is thereby possible to improve solder bondability of the solder joint material and of the soldering member.

In addition, in the embodiments of the invention, since formation/growth of a highly brittle intermetallic compound ($Cu_6Sn_5$) layer at a Cu/solder interface is suppressed by providing the surface-treated layer, it is possible to improve strength reliability and bending fatigue properties of the solder joints.

Furthermore, since the embodiments of the invention provide excellent joint reliability after soldering as described above, a decrease in power generation efficiency can be suppressed when applied to a solar cell module. Therefore, it is possible to obtain a photovoltaic cell excellent in power generation efficiency.

The following examples further illustrate the invention but the invention is not limited thereto.

EXAMPLES

Table 1 shows the configurations of the samples in Examples 1 to 4 and Comparative Examples 1 to 5. Table 1 also shows the evaluation results of the evaluation items described later.

TABLE 1

| | | | Surface-treated layer | | | Evaluation results | | | |
| --- | --- | --- | --- | --- | --- | --- | --- | --- | --- |
| | | Sheet material | Material | thickness (μm) | Presence of amorphous layer | Appearance (color, gloss) 100° C. | 85° C. × 85% | Oxidation resistance | Overall evaluation |
| Examples | 1 | Cu | Zn | 0.01 | present | ⊚ | ⊚ | ⊚ | ⊚ |
| | 2 | Cu | Zn | 0.05 | present | ⊚ | ⊚ | ⊚ | ⊚ |
| | 3 | Cu | Zn | 0.1 | present | ○ | ○ | ○ | ○ |
| | 4 | Cu | Zn | 0.3 | present | ○ | ○ | ○ | ○ |
| Comparative Examples | 1 | Cu | Zn | 1.0 | not present | X | X | X | X |
| | 2 | Cu | Zn | 0.02 | not present | Δ | X | Δ | X |
| | 3 | Cu | Zn | 0.02 | not present | X | X | X | X |
| | 4 | Cu | — | — | not present | X | X | X | X |
| | 5 | Cu—Zn alloy | — | — | not present | Δ | Δ | Δ | X |

The samples in Examples 1 to 4 shown in Table 1 were generally made as follows: a cover layer formed of zinc plating with various thickness (0.08 to 0.27 μm) was formed on a flat sheet formed of tough pitch copper by electrolytic plating and annealing was then performed in the ambient air. The details of Examples 1 to 4 and Comparative Examples 1 to 5 will be described later.

Meanwhile, in Comparative Example 1 for evaluating influence of the thickness of the zinc layer on the characteristics of the Cu-based metal material (Cu sheet), a zinc layer with a different thickness was formed and heat treatment was then performed in the same manner as Example 1. In Comparative Examples 2 and 3 for evaluating influence of the heat treatment conditions on the characteristics of the Cu-based metal material (Cu sheet), the sample was made under a different heat treatment condition (Comparative Example 2) or was made without heat treatment (Comparative Example 3).

Furthermore, as the samples of Comparative Examples 4 and 5, tough pitch copper (Comparative Example 4) and a Cu-30 mass % Zn alloy (Comparative Example 5) were prepared.

Presence of the amorphous layer shown in Table 1 was confirmed by RHEED analysis (Reflection High Energy Electron Diffraction). The samples showing a halo pattern indicating presence of the amorphous layer are indicated by "Present", and the samples showing electron diffraction spots indicating a crystalline structure are indicated by "Not present".

Here, appearance evaluation, oxidation resistance evaluation and overall evaluation of the obtained samples shown in Table 1 were performed as follows.

For evaluating "appearance", a constant temperature test to hold samples in the ambient air in a constant-temperature oven set at 100° C. for up to 1000 hours and a 100-hour holding test in a test chamber at a temperature of 85° C. and humidity of 85% were conducted. Using change in color and gloss before and after the tests as criteria for judgment, the samples with the least change were evaluated as "⊚", the samples with the most significant change and with associated deterioration in appearance were evaluated as "X", and the samples with the change in-between were evaluated as "Δ".

For evaluating "oxidation resistance", each sample was kept in the ambient air in a constant-temperature oven set at 100° C. for up to 1000 hours and an increase in oxide film was measured after the test. Based on comparison with the initial thickness (before the test) of the oxide film, the samples with the least change were evaluated as "⊚ (excellent)", the samples with the most significant change and with associated deterioration were evaluated as "X (bad)", and the samples with the change in-between were evaluated as either "○ (acceptable)" or "Δ (unacceptable)" depending on the extent of the change. Using comparison results with the initial thickness (before the test) of the oxide film as quantitative criteria, the samples of which oxide film after 1000 hours has a thickness three times or more were all evaluated as "X" regardless of the change in appearance.

For "overall evaluation", the results of the above items were comprehensively assessed, and ⊚ and ○ were judged as "passed the test" and Δ and × were judged as "failed the test".

The details of Examples 1 to 4 a.nd Comparative Examples 1 to 5 are described below.

Example 1

In Example 1, a 0.5 mm-thick flat sheet of TPC was prepared, a 0.008 μm-thick Zn layer was then formed on a surface of the flat sheet by electrolytic plating and heat treatment was subsequently performed in the ambient air at a temperature of 100° C. for 5 minutes, thereby obtaining a sample. Based on Auger analysis performed on the obtained sample from the surface in a depth direction, it was confirmed that a 0.01 μm-thick surface-treated layer composed of zinc (Zn), oxygen (O) and copper (Cu) was formed.

Example 2

In Example 2, a 0.5 mm-thick flat sheet formed of TPC was prepared, a 0.04 μm-thick Zn layer was then formed on a surface of the flat sheet by electrolytic plating and heat treatment was subsequently performed in the ambient air at a temperature of 120° C. for 10 minutes, thereby obtaining a sample. Based on Auger analysis performed on the obtained sample from the surface in a depth direction, it was confirmed that a 0.05 μm-thick surface-treated layer composed of zinc (Zn), oxygen (O) and copper (Cu) was formed.

Example 3

In Example 3, a 0.5 mm-thick flat sheet formed of TPC was prepared, a 0.08 μm-thick Zn layer was then formed on a surface of the flat sheet by electrolytic plating and heat treatment was subsequently performed in the ambient air at a temperature of 300° C. for 5 seconds, thereby obtaining a sample. Based on Auger analysis performed on the obtained sample from the surface in a depth direction, it was confirmed that a 0.1 μm-thick surface-treated layer composed of zinc (Zn), oxygen (O) and copper (Cu) was formed.

Example 4

In Example 4, a 0.5 mm-thick flat sheet formed of TPC was prepared, a 0.27 μm-thick Zn layer was then formed on a surface of the flat sheet by electrolytic plating and heat treatment was subsequently performed in the ambient air at a temperature of 150° C. for 30 seconds, thereby obtaining a sample. Based on Auger analysis performed on the obtained sample from the surface in a depth direction, it was confirmed that a 0.3 μm-thick surface-treated layer composed of zinc (Zn), oxygen (O) and copper (Cu) was formed.

Comparative Example 1

In Comparative Example 1, a 0.5 mm-thick flat sheet formed of TPC was prepared, a 0.95 μm-thick Zn layer was then formed on a surface of the flat sheet by electrolytic plating and heat treatment was subsequently performed in the ambient air at a temperature of 100° C. for 5 minutes, thereby obtaining a sample. Based on Auger analysis performed on the obtained sample from the surface in a depth direction, it was confirmed that a 1 μm-thick surface-treated layer composed of zinc (Zn) and oxygen (O) was formed.

Comparative Example 2

In Comparative Example 2, a 0.5 mm-thick flat sheet formed of TPC was prepared, a 0.01 μm-thick Zn layer was then formed on a surface of the flat sheet by electrolytic plating and heat treatment was subsequently performed in the ambient air at a temperature of 400° C. for 30 seconds, thereby obtaining a sample. Based on Auger analysis performed on the obtained sample from the surface in a depth direction, it was confirmed that a 0.02 μm-thick surface-treated layer composed of zinc (Zn), oxygen (O) and copper (Cu) was formed.

Comparative Example 3

In Comparative Example 3, a 0.5 mm-thick flat sheet formed of TPC was prepared and a 0.02 μm-thick Zn layer was then formed on a surface of the flat sheet by electrolytic plating, thereby obtaining a sample.

Comparative Example 4

In Comparative Example 4, a 0.5 mm-thick flat sheet formed of TPC was used as an evaluation sample.

Comparative Example 5

In Comparative Example 5, a 0.5 mm-thick flat sheet formed of Cu-30 mass % Zn alloy (brass) was used as an evaluation sample.

Figure 7:
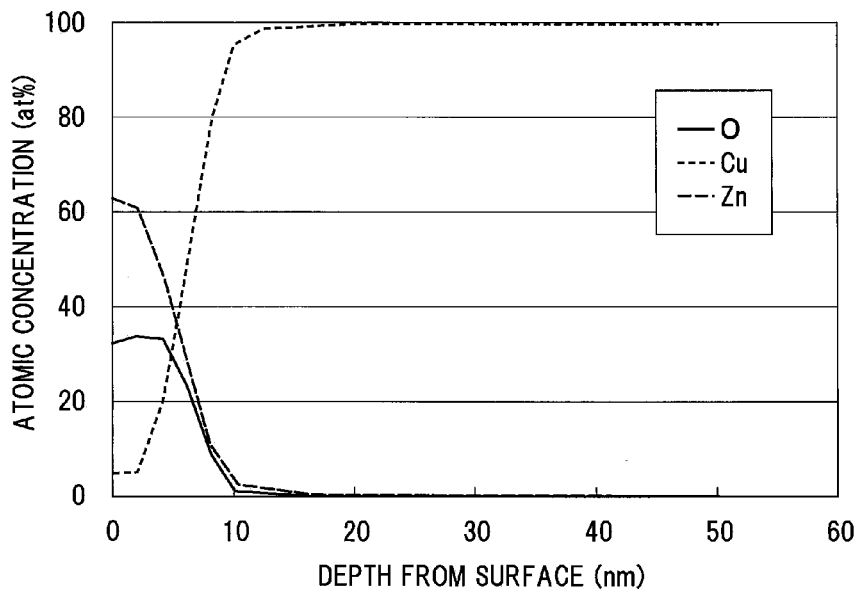
FIG. 7 is a graph showing the results of Auger elemental analysis performed on a sample in Example 1 of the invention, where the sample after 3600 hours of a constant temperature test (at 100° C.) is analyzed from the surface in a depth direction while repeating sputtering.

FIG. 7 is a graph showing the results of Auger elemental analysis performed on the sample in Example 1, where the sample after 3600 hours of a constant temperature test (at 100° C.) is analyzed from the surface in a depth direction while repeating sputtering. The horizontal axis indicates a depth (nm) from the surface and the vertical axis indicates an atomic concentration (at %). Then, a solid line shows the atomic concentration (at %) as the ratio of the oxygen content, a long-dashed line shows the atomic concentration of zinc and a short-dashed line shows the atomic concentration of copper. The oxygen penetration depth was about 8 nm from the surface, and the average elemental content of each element particularly in the surface portion at a depth of 0 to 3 nm, which is defined as [the maximum atomic concentration+the minimum atomic concentration (at the depth of 0 to 3 nm)]/2, was 60 at % for zinc (Zn), 33 at % for oxygen (O) and 7 at % for copper (Cu) in Example 1.

In addition, based on the results including other Examples, it was found that the average elemental content of zinc (Zn) was in a range of 35 to 68 at %, that of oxygen (O) in a range of 30 to 60 at % and that of copper (Cu) in a range of 0 to 15 at %.

On the other hand, the sample in Comparative Example 1 contained 33 at % of zinc (Zn), 41 at % of oxygen (O) and 26 at % of copper (Cu), and the sample in Comparative Example 5 contained 5 at % of zinc (Zn), 46 at % of oxygen (O) and 49 at % of copper (Cu).

Figure 8:
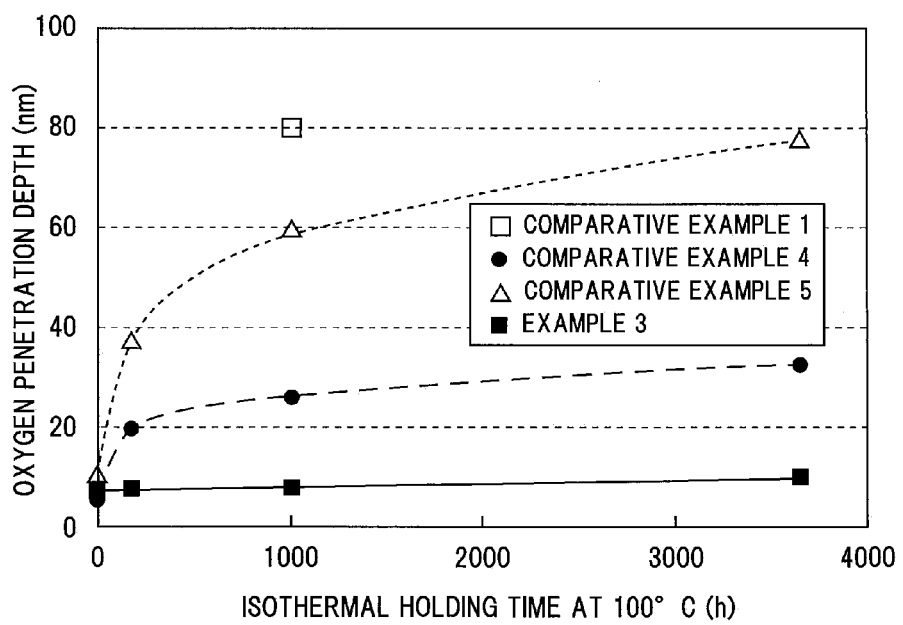
FIG. 8 is a graph showing time-dependent change in an oxygen penetration depth from the surface layer (thickness of oxide film) in the constant temperature test (at 100° C.) conducted on samples in Example 1 of the invention and Comparative Examples 1, 4 and 5.

FIG. 8 is a graph showing time-dependent change in an oxygen penetration depth from the surface layer (thickness of oxide film) in the constant temperature test (at 100° C.) conducted on the samples in Example 1 and Comparative Examples 1, 4 and 5. The oxygen penetration depth was derived by Auger analysis performed on the samples held for various periods of time from the surface in a depth direction while repeating sputtering. In FIG. 8, the horizontal axis indicates isothermal holding time (h) at 100° C. and the vertical axis indicates the oxygen penetration depth (nm). Then, a solid line shows oxygen penetration depth in Example 1 and dashed lines show the oxygen penetration depth in Comparative Example 4 and that in Comparative Example 5. Comparative Example 1 is indicated by a single point.

In Example 1, as shown in FIG. 7, the oxygen concentration in the vicinity of the surface increased after holding 3600 hours but the penetration depth of oxygen hardly changed before and after the test and was about not more than 0.01 μm, which shows that the sample in Example 1 has high oxidation resistance.

Meanwhile, as shown in FIG. 8, a thickness of an oxygen-containing layer before the constant temperature test was about 0.006 μm from the surface in both Comparative Example 4 (tough pitch copper) and Comparative Example 5, which is comparable to the depth before the test in Example 1. However, after the 3600 hours of the holding test, the oxygen concentration in the vicinity of the surface in Comparative Example 4 significantly increased as compared to that before the constant temperature test, and also, the oxygen penetration depth in Comparative Example 4 was about 0.036 μm which is 5 times or more of that before the test and the oxygen penetration depth in Comparative Example 5 was about 0.078 μm which is 13 times that before the test. In addition, in Comparative Examples 4 and 5, reddish brown discoloration was observed on the appearance after the test and it was obvious that a thick oxygen-containing layer was formed. In addition, in Comparative Examples 1 in which a 0.95 μm-thick Zn layer is formed on TPC, the oxygen penetration depth already reached about 0.080 μm after 1000 hours of the holding test.

Figure 9:
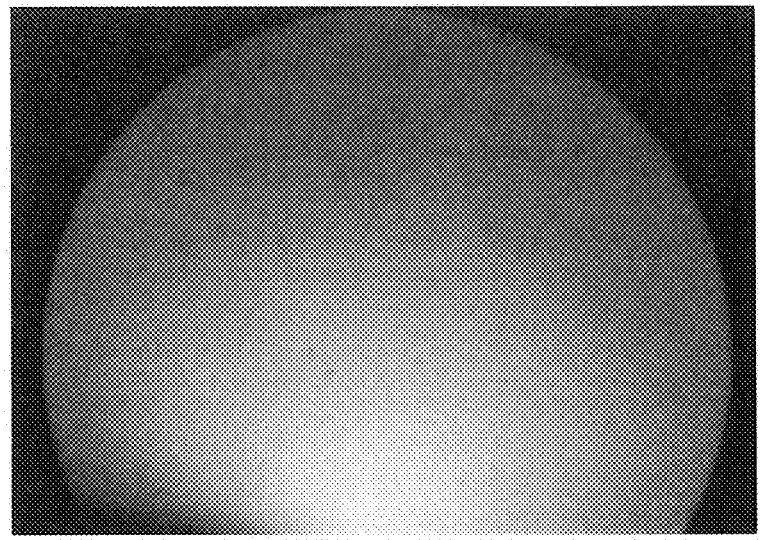
FIG. 9 is an electron diffraction image showing the result of RHEED analysis performed on the sample in Example 1 of the invention.

FIG. 9 shows the result of RHEED analysis performed on the surface of the sample in Example 1 which is excellent in oxidation resistance. A halo pattern is shown in the electron diffraction image and this reveals that an amorphous layer is formed on the surface as shown in Table 1. On the other hand, it was confirmed that the sample in Comparative Example 4 having less oxidation resistance was a crystalline substance composed of copper and oxygen.

In addition, according to Table 1, in Examples 1 to 4 in which surface-treated layers with various thicknesses of 0.01 to 0.3 μm are respectively provided and each have an amorphous structure, good results were obtained from the evaluations of appearance and oxidation resistance. Excellent characteristics were exhibited especially when the thickness of the surface-treated layer was 0.01 to 0.05 μm.

From the above results, it was confirmed that, in the structures of Examples 1 to 4, the process of oxidation does not occur and a stable surface condition is maintained even in the constant temperature test at 100° C. for 1000 hours and also under the environment of 85° C. and 85% of humidity.

On the other hand, satisfactory characteristics were not obtained in some cases in Comparative Examples 1 to 3 even though a Zn-based surface-treated layer is provided in the same manner. The evaluation result of oxidation resistance is "Fail" for all of the samples in which an amorphous surface layer was not formed, such as Comparative Example 1 with thick zinc, Comparative Example 2 with excessive heat treatment after plating and Comparative Example 3 with no heat treatment after plating.

It was confirmed from the above results that an amorphous surface-treated layer allows growth of an oxide film to be suppressed.

Next, the following tests of solder bondability and solder joint reliability were conducted on each material (sample) formed under the surface treatment conditions described in Example 1, 3, Comparative Example 1 or 4 of Table 1.

Solder Bondability

Using a Pb-free solder having a composition of Sn-3.5Ag-0.5Cu, each sample processed in size of 5 mm in width×50 mm in length×0.2 mm in thickness was soldered to a Ni/Au-plated Cu sheet at 250° C. Soldering was carried out under two types of conditions: immediately after processing the sample; and after holding the sample in the ambient air at 100° C. for 100 hours. Strength of the joint of each soldered sample was evaluated by a tensile test.

Solder Joint Reliability

Using a Pb-free solder having a composition of Sn-3.5Ag-0.5Cu, each sample processed in size of 5 mm in width×50 mm in length×0.2 mm in thickness was soldered to a Ni/Au-plated Cu sheet at 250° C. immediately after processing the sample. After soldering, the soldered sample was subjected to 500 cycles of cooling load from −30° C. to +100° C. and joint reliability of the solder joint was evaluated.

In each of solder bondability evaluation and solder joint reliability evaluation, the samples exhibiting joint strength of not less than 90% of strength of Cu base material were evaluated as "○ (passed the test)", the samples exhibiting not less than 70% and less than 90% of the strength were evaluated as "Δ (failed)", and the samples exhibiting less than 70% of the strength were evaluated as "X (also failed)".

TABLE 2

| | Solder bondability evaluation | | |
|---|---|---|---|
| Evaluation samples | Immediately after processing the sample | After holding at 100° C. | Solder joint reliability evaluation |
| Example 1 | ○ | ○ | ○ |
| Example 3 | ○ | ○ | ○ |
| Comparative Example 1 | Δ | X | X |
| Comparative Example 4 | ○ | X | Δ |

As obvious from Table 2, solder bondability immediately after processing the sample was low only in Comparative Example 1 and were sufficiently strong in others. When soldering was carried out after holding at 100° C. in order to examine influence of oxidation, etc., during storage, joint strength was low in Comparative Examples 1 and 4. At the joints in these two Comparative Examples, wetting of solder was obtained only partially, not on the entire surface of the joint, and this is considered to be a cause of a decrease in joint strength. It is believed that the deterioration in solderability is caused by influence of oxidation on the surface of a soldered piece. On the other hand, in Examples 1 and 3, joint strength was satisfactory even soldering was carried out after being held at 100° C. It is believed that wetting of solder was satisfactory.

Regarding reliability of the solder joint, joint strength of Comparative Example 4, which was excellent immediately after processing the sample, decreased after the cycle test.

It is considered that this is because the $Cu_6Sn_5$ compound formed at a joint interface was grown by the cycle test. In both Examples 1 and 3, high joint strength was maintained even after the cycle test.

The above results show that Examples, in which a predetermined surface-treated layer is provided, are excellent in solder bondability as well as in joint reliability after soldering.

It should be noted that the invention is not intended to be limited to the embodiments and various kinds of modifications can be implemented.

What is claimed is:

1. A solder joint material, comprising:
a copper-based metal material comprising mainly copper,
a surface-treated layer coextensive with an upper surface of the copper-based metal material and comprising an amorphous layer comprising oxygen and a metal with a higher oxygen affinity than the copper, the metal consisting of zinc; and
a Sn-based solder plating layer provided on the surface-treated layer.

2. The solder joint material according to claim 1, wherein the solder joint material is plate-shaped, and wherein the solder joint material, further comprising:
another surface-treated layer coextensive with a lower surface of the copper-based metal material and comprising an amorphous layer comprising oxygen and a metal with a higher oxygen affinity than the copper, the metal consisting of zinc; and
another Sn-based solder plating layer provided on the other surface-treated layer of the copper-based metal material.

3. The solder joint material according to claim 1, wherein the surface-treated layer further comprises a diffusion layer under the amorphous layer, and wherein the diffusion layer comprises copper and the metal with a higher oxygen affinity than the copper, or oxygen, copper, and the metal with a higher oxygen affinity than the copper.

4. The solder joint material according to claim 1, wherein the surface-treated layer has a thickness of not less than 8 nm and not more than 300 nm.

5. A solar cell module, comprising the solder joint material according to claim 1; and a solar cell soldered by using the solder joint material.

6. The solder joint material according to claim 1, wherein the surface-treated layer further comprises a diffusion layer under the amorphous layer, and wherein the diffusion layer consists of copper and a single elemental metal with a higher oxygen affinity than the copper, or oxygen, copper, and a single elemental metal with a higher oxygen affinity than the copper.

7. The solder joint material according to claim 1, wherein the copper-based metal material consists of copper.

8. A solar cell module, comprising: a soldering member, including: a copper-based metal material comprising mainly a copper; and a surface-treated layer coextensive with an upper surface of the copper-based metal material and comprising an amorphous layer comprising oxygen and a metal with a higher oxygen affinity than the copper, the metal consisting of zinc, wherein the surface-treated layer has a thickness of not less than 8 nm and not more than 300 nm; and
a solar cell soldered by the soldering member.

9. A solder joint material, comprising
a copper-based metal material comprising mainly copper,
a surface-treated layer coextensive with an upper surface of the copper-based metal material and comprising an amorphous layer comprising the copper diffused from the copper-based metal material, a metal with a higher oxygen affinity than the copper, and oxygen, the metal consisting of zinc, and a Sn-based solder plating layer provided on the surface-treated layer.

10. The solder joint material according to claim 9, wherein the solder joint material is plate-shaped, and wherein the solder joint material, further comprising:
another surface-treated layer coextensive with a lower surface of the copper-based metal material and comprising an amorphous layer the copper diffused from the copper-based metal material, a metal with a higher oxygen affinity than the copper, and oxygen, the metal consisting of zinc; and
another Sn-based solder plating layer provided on the other surface-treated layer of the copper-based metal material.

11. The solder joint material according to claim 9, wherein the surface-treated layer further comprises a diffusion layer under the amorphous layer, and wherein the diffusion layer comprises copper and the metal with a higher oxygen affinity than the copper, or oxygen, copper and a metal with a higher oxygen affinity than the copper.

12. The solder joint material according to claim 9, wherein the surface-treated layer has a thickness of not less than 8 nm and not more than 300 nm.

13. A solar cell module, comprising the solder joint material according to claim 9; and a solar cell soldered by using the solder joint material.

\* \* \* \* \*